Feb. 3, 1959 A. H. DICKINSON 2,872,592

ELECTRONIC AMPLIFIER

Filed Aug. 3, 1950 2 Sheets-Sheet 1

INVENTOR
ARTHUR H. DICKINSON
BY John R. Shipman
ATTORNEY

Feb. 3, 1959 A. H. DICKINSON 2,872,592

ELECTRONIC AMPLIFIER

Filed Aug. 3, 1950 2 Sheets-Sheet 2

INVENTOR
ARTHUR H. DICKINSON
BY John R. Shipman
ATTORNEY

United States Patent Office 2,872,592
Patented Feb. 3, 1959

2,872,592

ELECTRONIC AMPLIFIER

Arthur H. Dickinson, Greenwich, Conn., assignor to International Business Machines Corporation, New York, N. Y., a corporation of New York Application August 3, 1950, Serial No. 177,446

15 Claims. (Cl. 307—88.5)

This invention relates to an electronic amplifier employing a translating device, such as a semiconductor triode, and to such an amplifier arranged as a trigger circuit.

A semiconductor triode, called a "transistor," and its arrangement in an amplifier circuit have been described in articles by Bardeen and Brattain in The Physical Review 75, 1208—April 1949, and by Becker and Shive in Electrical Engineering 68, 215—March 1949. This prior amplifier circuit comprises a semiconductor translating device including a semiconductor having emitter, collector and base connections and a source of direct current voltage, with the collector connected through a load resistor to the negative terminal of the voltage source, the base connected to an intermediate terminal and the emitter connected through a signal source to the positive terminal. Because of the characteristics of this type of translating device, variations in current through the emitter causes corresponding but greater variations in current through the collector. Consequently, a change in the signal voltage producing a corresponding change in the emitter current, results in a change in the collector current which is larger than the emitter current change.

Electronic trigger circuits, which have two conditions of stability, are also known in the art. The most frequently used trigger circuit is the Eccles-Jordan circuit or a modification thereof. The Eccles-Jordan circuit incorporates two vacuum tubes, one tube only being conductive in one stable state of the circuit while the other tube only is conductive in the other stable state. A change from one stable state to the other may be accomplished by the application of an input voltage impulse effective to decrease the current through the conductive tube.

It is an object of the present invention to provide a novel amplifier circuit.

It is another object of the present invention to provide a novel amplifier circuit which incorporates a semiconductor translating device.

Another object of my invention is to provide a new and improved amplified circuit employing a semiconductor translating device, in which circuit the stability is increased.

A further object of my invention is to provide a new and improved amplifier circuit employing a semi-conductor translating device in which greater amplication is available.

A still further object is to provide a semiconductor translating device amplifier circuit which has greater stability, more amplification and consumes less input power.

It is also an object of my invention to provide a novel amplifier circuit arranged as a bi-stable positive feedback amplifier having a gain greater than one to form a trigger circuit.

An object of my invention is to provide a novel amplifier circuit employing a semiconductor translating device and arranged as a bi-stable positive feedback amplifier having a gain greater than one to form a trigger circuit.

Still another object is to provide a bi-stable trigger circuit employing a semiconductor translating device, which circuit may be shifted from one stable state to the other by an input voltage impulse.

Another object is to provide a bi-stable trigger circuit employing a semiconductor translating device in which each of a succession of input voltage impulses individually supplied thereto causes the trigger circuit to assume the opposite stable state.

It is a further object of my invention to provide an amplifier employing a semiconductor translating device and arranged as a gate circuit.

In accordance with my invention I provide a new and improved amplifier circuit incorporating a translating device with input and output circuits connecting it to a suitable voltage supply, the characteristics of the translating device providing an output current variable with variations in input voltage applied to the device. A semiconductor translating device including a semiconductor having emitter, collector and base connections is especially suitable.

In a semiconductor translating device of the kind indicated, current may flow with a low impedance through the emitter into the semiconductor but the output current from the semiconductor through the collector normally encounters a relatively high impedance. This impedance is provided by an electrical barrier through which it is difficult for current carriers of the sign of the carriers normally present in the semiconductor to pass toward the collector. Such a barrier may be formed by employing a point contact, rectifying, collector connection to the semiconductor or in various other suitable ways. Current flowing into the semiconductor through the emitter introduces into the semiconductor current carriers of a sign opposite to that of the carriers normally present therein. The current carriers so introduced are effective to reduce the impedance offered to current flowing out through the collector. The greater the number of carriers of opposite sign introduced, the lower the impedance becomes and the collector current varies with the emitter current. The base connection provides a low impedance path for current therethrough into or out of the semiconductor.

In my improved amplifier circuit incorporating such a semiconductor translating device, an impedance element, such as a vacuum tube, is connected so that a substantial portion of the emitter current passes therethrough. The impedance of the vacuum tube may be varied in accordance with the input signal, by applying the signal to the control grid of the tube, to control the magnitude of the emitter current. The collector current then varies in accordance with variations in the emitter current and also provides an amplification through the electrical action within the semiconductor.

I have found that this arrangement provides a greater stability than exists in the prior amplifier circuits. In addition, when the input is applied to the grid of the vacuum tube rather than directly in the emitter current as in the prior circuits, the input power consumed is substantially less. Moreover, a given signal change on the grid of the tube produces a greater change in the current passing through the tube and thereby in the emitter current so that a greater amplification is possible.

I also provide, in accordance with my invention, an amplifier of the type described above connected with a positive feedback and a gain greater than one to form a trigger circuit. In this trigger circuit the vacuum tube, through which a substantial portion of the emitter current passes, is arranged to be responsive to variations in the output current through the collector to effect corresponding variations in the emitter current in the same direction. The trigger circuit is then bi-stable. In one stable state the current through the emitter and tube and through the collector are both at a minimum while in the other stable state they are both at a maximum. Switching of the trigger circuit from one stable state to the other may be accomplished by momentarily varying either the emitter or the collector current as, for example, by the application of a suitable input voltage impulse.

There is further provided, in accordance with my invention, an amplifier of the type described in which a screen grid-control grid-cathode portion of a pentode is connected to control the emitter current of the semiconductor translating device with a positive feedback through the control grid. The suppressor grid of the pentode receives a signal voltage which causes corresponding variations in the anode current only while the screen grid to cathode current is at a maximum.

Other objects and features of the invention will be pointed out in the following description and claims and illustrated in the accompanying drawings, which disclose, by way of example, the principle of the invention and the best mode which has been contemplated of applying that principle.

Figure 1:
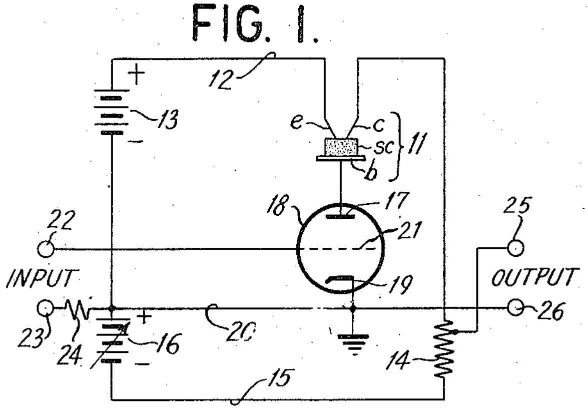
Fig. 1 is a circuit diagram of an amplifier in accordance with my invention.

The amplifier illustrated in Fig. 1 incorporates a semiconductor translating device 11 which includes a suitable semiconductor *sc*, such as n-type germanium, on the surface of which are two suitably arranged point-contact, rectifying, electrodes forming an emitter *e* and a collector *c*, and a large area ohmic contact electrode forming the base *b*. The emitter *e* is connected to a positive voltage supply line 12, which is shown connected to the positive terminal of a direct current voltage source represented by a battery 13. The collector *c* is connected through a load resistor 14 to a negative voltage supply line 15 which is shown connected to the negative terminal of another direct current voltage source represented by a battery 16. The base *b* is connected to the anode 17 of a vacuum tube 18, the cathode 19 of which is connected to a grounded line 20 which, in turn, is connected to the negative terminal of battery 13 and the positive terminal of battery 16. The control grid 21 of the vacuum tube 18 is connected to an input terminal 22 and another input terminal 23 is connected through a resistor 24 to the line 20. The output of the amplifier appears between a terminal 25 connected to an intermediate tap on the resistor 14 and a terminal 26 connected to grounded line 20.

In considering the operation of the amplifier shown in Fig. 1, it is to be remembered that the characteristics of a semiconductor translating device as shown having an n-type semiconductor are such that with the emitter positive and the collector negative, current may flow through the emitter into the semiconductor, from the semiconductor through the collector, and either from or into the semiconductor through the base depending upon the voltage relationships and the nature of the external circuits between the base, emitter and collector. The impedance offered by the semiconductor to current flowing through the collector varies with the magnitude of the current flowing into the semiconductor through the emitter. Consequently, the collector current varies in magnitude with the emitter current and in most cases, and preferably in the amplifier of Fig. 1, the variation in emitter current is amplified in the variation of the collector current.

Although the use of a semiconductor of n-type germanium has been described, it will be understood by those skilled in the art that p-type germanium might be used with the voltage polarities reversed or other suitable semiconductors may be employed.

With an input signal voltage applied between the input terminals 22 and 23 in Fig. 1, variations in the signal voltage appear as variations in the level of the grid voltage of tube 18, resulting in corresponding variations in the current through the tube. Current flows from the positive supply line 12 through the emitter *e* into the semiconductor *sc* and from the semiconductor through the base *b* and the tube 18 to the grounded supply line 20. Current also flows from the positive supply line 12 through the emitter *e*, semiconductor *sc*, collector *c* and resistor 14 to the negative line 15. When the conductivity of, or current flow through, the tube 18 is varied in accordance with the input signal voltage, the emitter current is correspondingly varied in a greater degree, by reason of amplification afforded by the tube, to cause a variation in the same direction of the collector current in a still greater degree by reason of amplification afforded by the semiconductor translating device. Variations in the collector current, of course, cause variations in the IR voltage drop across the resistor 14, a portion of which appears between the output terminals 25 and 26.

As previously mentioned the amplifier circuit of Fig. 1 has been found to be quite stable and provides a substantial amplification. No substantial input power is consumed and the output, which is in phase with the input, may be applied directly to another similar amplifier stage without further coupling.

Figure 2:
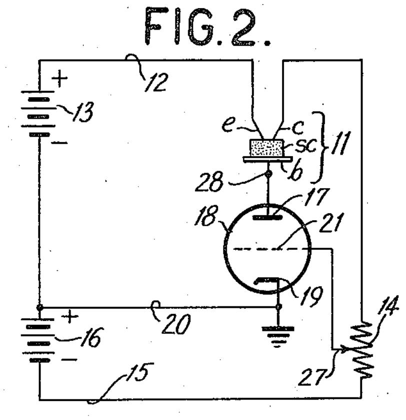
Fig. 2 is a circuit diagram of an amplifier arranged as a trigger circuit in accordance with my invention.

The trigger circuit shown in Fig. 2 is an amplifier of the general type disclosed in Fig. 1 but arranged to form a bi-stable positive feedback amplifier with a gain greater than one. This trigger circuit is shown in its simplest form without input or output circuits or other elements which are not necessary to an understanding of the triggering or switching operation of the device. The circuit diagram of Fig. 2 is similar to that of Fig. 1 with the exception that the control grid 21 of the tube 18 is connected to an adjustable tap 27 on the resistor 14. The same reference characters are used to designate corresponding elements.

In considering the operation of the trigger circuit of Fig. 2, let it be assumed that tube 18 is initially substantially non-conductive. A small current is then flowing from the positive supply line 12 through the emitter *e*, the semiconductor *sc*, and the collector *c* of the translating device 11, and the resistor 14 to the negative supply line 15. The tap 27 on the resistor 14 is adjusted so that with this small current through the resistor 14, the grid 21 is sufficiently negative relative to the cathode 19 to keep the tube 18 substantially non-conductive. The circuit from the base *b* of the translating device to the grounded line 20 is then maintained open by the non-conductive tube 18 and no current flows therethrough. This is the first stable state of the trigger circuit, the grid 21 being sufficiently negative that small variations in the collector current do not have any substantial effect on the conductivity of the tube.

With the trigger circuit of Fig. 2 in its first stable state, let it be assumed that through some external means the emitter current is momentarily increased. This might be accomplished, for example, by causing the base *b* of the translating device 11 to become highly negative momentarily with respect to the emitter *e* through the application of a negative voltage impulse from an external source at a point 28 between the base *b* and the anode 17 of the tube 18.

When the base *b* thus becomes more negative, another path for current leaving the semiconductor *sc* is established. Current entering the semiconductor *sc* through emitter $e$ then flows out through the collector $c$ and the resistor 14 in one path and also flows out along a parallel path through base $b$ and point 28. With this parallel path arrangement, the total emitter current increases substantially. Now, because of the characteristics of the translating device previously mentioned, the increase in the emitter current causes an increase in the collector current. With such an increase in the collector current, the IR voltage drop across the load resistor 14 increases, making the adjustable tap 27 and the grid 21 of tube 18 less negative relative to the cathode 19. As the grid 21 bceomes less negative the tube 18 becomes conductive. A current path is then completed from the base $b$ to the grounded line 20 through the tube 18, causing the emitter current to increase still further even though the input impulse may be decreasing or ending. This further increase in the emitter current, causes another increase in the collector current which results in the grid 21 becoming even less negative and somewhat positive. Thus, a regenerative effect occurs in which an increase in emitter current causes an increase in the collector current, resulting in a further increase in the emitter current until the circuit reaches a second stable state. As this stable state is reached, the regenerative effect terminates. The second stable state is attained when the voltage relationship between the grid and cathode of the tube reaches the point at which, because of the well-known tube characteristics, further increases in the grid voltage do not increase the tube current sufficiently to cause any substantial increase in collector current.

Of course with input impulses of different magnitudes and waveforms and with different voltages and resistances in the circuit, the time of a switching operation and the amount of regeneration may be different. With an impulse of high magnitude and relatively long duration the tube 18 may be fully conductive by the time the impulse ends. On the other hand with an impulse of lesser magnitude and duration, the tube 18 may not be fully conductive by the time the impulse ends but the regenerative operation continues until the switching is complete. It is necessary of course that the impulse be of sufficient magnitude and duration to place the regenerative effect of the circuit in operation.

With the circuit of Fig. 2 in its second stable state wherein substantial current flows through the collector $c$ of transistor 11 and through the tube 18, the circuit may be switched back to its first stable state in which minimum current flows through the collector and through the tube, by causing the emitter current to be decreased momentarily by some external means. This may be accomplished, for example, by applying a negative voltage impulse to the grid 21 of tube 18. This impulse must be of such size and duration as to cause the current flow through the tube 18 to decrease sufficiently that the resulting decrease in emitter current causes a decrease in the collector current of an amount sufficient to cause the adjustable tap 27 and grid 21 to become more negative and initiate a further decrease in current through the tube 18. This regenerative effect continues with a decrease in the current through tube 18 causing a further decrease in collector current which, in turn, results in a still further decrease in the tube current until the tube is cut off and minimum current conditions exist. Under such conditions slight variations in collector current cannot act through the tube to cause sufficient change in the emitter current to initiate a change in the status of the trigger circuit. Thus the circuit is returned to its first stable state.

It is then apparent that the trigger circuit of Fig. 2 has two alternate stable states. In the first state, both the current flowing through the tube 18 and the current through the collector $c$ of the translating device 11 are at a minimum. In the second state, both the current flowing through the tube and the current through the collector $c$ are at a maximum. The tube 18 is effective to control the magnitude of the emitter current in accordance with the magnitude of the collector current between the limits of the two stable states. Similarly, the translating device is effective to cause the magnitude of the collector current to vary in accordance with the magnitude of the emitter current between the limits of the two stable states. Consequently, as previously explained, an appropriate change in either the emitter current or the collector current produced by some external means, such as a suitable applied voltage impulse, causes the trigger circuit to change from one stable state to the other.

Figures 3, 4:
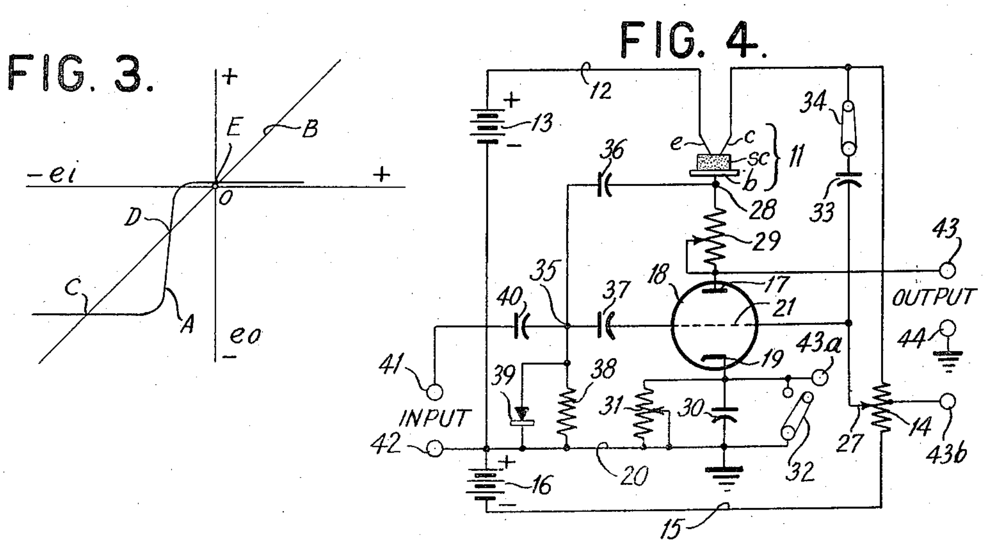
Fig. 3 is a graphical representation of voltage relationships useful in understanding the operation of the circuit of Fig. 2.
Fig. 4 is a circuit diagram of the preferred embodiment of a trigger circuit incorporating my invention.

The curve A shown in Fig. 3 is formed by plotting output voltage, $e_0$, appearing between the adjustable tap 27 and the cathode 19 in the circuit of Fig. 2 against a variable input voltage, $e_i$, between the grid 21 and the cathode 19, with the connection between the grid 21 and adjustable tap 27 broken. As the input voltage, $e_i$, is varied the curve A on the graph assumes the general form of an S, as shown, but with a positive slope on the center portion of the curve. The curve A is largely contained within that portion of the graph in which both $e_0$ and $e_i$ are negative.

Now it is evident that the locus of all points at which $e_0$ equals $e_i$ in both magnitude and sign on the graph is a 45° line B of positive slope through the origin. It is also true that a trigger circuit must have at least two values at which $e_0$ equals $e_i$ and at which the circuit is in a stable state. By adjusting the parameters of the circuit of Fig. 2 the slope of the center portion of the curve A may be varied and the curve shifted to a position in which it is intercepted three times, at C, D, and E, by a 45° line through the origin. At each of these three points, C, D, and E, $e_0$ equals $e_i$.

At point C on the lower portion of curve A in Fig. 3, both $e_i$ and $e_0$ are highly negative and the tube 18 is non-conductive. Consequently, small variations in $e_i$ do not effect the conductivity of the tube 18 and do not change the output voltage $e_0$. Therefore, the bottom portion of the curve A is substantially horizontal. Since at point C, $e_0$ not only equals $e_i$ but is also substantially constant for small variations in $e_i$, the trigger circuit is in a stable condition.

As $e_i$ is made sufficiently less negative from the lower point C, the tube 18 becomes conductive and the output voltage $e_0$ changes rapidly with small changes in $e_i$ and the curve A has a steep slope as in the center portion thereof. At the point D on the center portion of the curve A, $e_0$ is again equal to $e_i$. However, the circuit is not in a stable state at this point for even slight variations in $e_i$ produce large variations in $e_0$.

As $e_i$ becomes still less negative from the point D, $e_0$ continues to change rapidly with small variations in $e_i$ until the grid of the tube becomes sufficiently less negative and somewhat positive so that further changes in $e_i$ do not produce any substantial changes in $e_0$ and the curve A again becomes substantially horizontal. At the point E, $e_0$ again equals $e_i$ and since small changes in $e_i$ do not produce any substantial changes in $e_0$ the circuit is in another stable state.

With the circuit arranged to produce a curve of $e_0$ vs. $e_i$ which will intersect a 45° line of positive slope through the origin, the grid 21 may be connected to the adjustable tap 27 and the resulting circuit may be operated as a trigger circuit. The connection of the grid 21 to the adjustable tap 27 provides a positive feedback and since the curve A intersects the 45° line three times, the voltage gain of the amplifier must be greater than one.

It is to be noted that in this trigger circuit it is not necessary for the translating device 11 to have a high amplification factor in that a given change in the emitter current does not have to produce a greater change in the collector current. It is merely necessary that the change in the collector current shall cause a sufficient change in the tube impedance to produce enough of a change in the emitter current to provide a still further change in the collector current. This is important because it avoids close tolerance requirements in the semiconductor translating device which would substantially increase the difficulties and expense of manufacture. Of course, a semiconductor translating device with a high amplification factor may be used efficiently in the circuit. It is also apparent that the circuit need not be specifically designed for any particular translating device but various ones may be used satisfactorily.

While the operation of the trigger circuit of Fig. 2 has been described with switching being initiated by negative impulses at point 28 and at the grid 21, it will be evident that other arrangements may be used to change the magnitude of either the emitter current or the collector current to initiate a switching operation.

In Fig. 4 there is shown a circuit diagram of a preferred trigger circuit similar to that of Fig. 2, and employing the same principles, but which incorporates a few additional elements, including input and output arrangements, designed to make the circuit more suitable for practical purposes. In particular, the circuit of Fig. 4 is arranged for scaling in response to negative input voltage impulses supplied in succession at a single input terminal. Thus, a negative input impulse supplied to the input terminal causes the trigger circuit to switch from its original stable state to the other stable state and the next succeeding input impulse at the same terminal switches it back. In the circuit of Fig. 4 the same reference numbers are employed to represent corresponding elements.

Inspection of Fig. 4 reveals that the circuit is identical with that shown in Fig. 2 with the following exceptions. An adjustable resistor 29 is interposed in the circuit between the base *b* of translating device 11 and the anode 17 of vacuum tube 18. A condenser 30 shunted by an adjustable resistor 31 and a normally-open switch 32 is interposed between the cathode 19 of tube 18 and the grounded supply line 20. A condenser 33 is connected through a normally closed switch 34 from the collector *c* of the translating device 11 to the grid 21 of tube 18 and in shunt with that portion of the resistor 14 between the collector *c* and the adjustable tap 27. The point 28, between the base *b* and anode 17, and the grid 21 of tube 18 are connected together at a junction point 35 by coupling condensers 36 and 37, respectively. This junction point 35 is connected through a resistor 38 in parallel with a diode rectifier 39 to the grounded line 20 with the rectifier offering its lower resistance to current flowing toward the grounded line 20. The junction point 35 is also coupled through another condenser 40 to a terminal 41 which together with a grounded terminal 42 forms the main input terminals. In addition, a pair of output terminals 43 and 44 are provided, one connected to the anode 17 of tube 18 and the other connected to the ground, the resistor 29 providing greater voltage variations with each switching of the trigger circuit to produce a substantial output impulse across the terminals 43 and 44. Other output terminals 43*a* and 43*b* connected to the cathode 19 and the resistor 14, respectively, may be used individually with terminal 44 in place of terminal 43, if desired.

Input impulses are to be supplied from a suitable source at the input terminals 41 and 42 and each impulse appears simultaneously as a negative or falling front impulse at the point 28 and at the grid 21 of the tube 18 through coupling condensers 40, 36 and 37 in Fig. 4. The resistor 38 and rectifier 39 are provided to prevent any rising portions of the input impulse from affecting the trigger circuit.

Now analysis of the triggering operation of the circuit in Fig. 4 indicates that a negative impulse appearing simultaneously at point 28 and grid 21 tends to produce two opposite effects. If the trigger circuit is in its first stable state, in which the tube 18 is substantially non-conductive and a minimum current flows through the collector *c*, a negative impulse at the grid 21 has no effect on the already non-conductive tube 18 except that it tends to maintain the tube non-conductive. The same negative impulse at point 28, however, causes an increase in the collector current, as previously explained, which tends to make the grid 21 less negative to cause the tube 18 to become conductive. On the other hand, if the trigger circuit is in its second stable state in which a maximum current flows in both tube 18 and the collector *c*, a negative input impulse on the grid 21 causes the tube 18 to become less conductive, thereby tending to decrease the emitter current. At the same time, the negative input impulse at point 28 tends to increase the emitter current.

Examination of the circuit of Fig. 4 in view of the previous discussion of Fig. 2 reveals that to enable switching from an initial to a final stable state in a scaling operation of a trigger circuit with an input impulse appearing simultaneously at point 28 and at the control grid 21 of the tube 18, it is necessary that the impedance of the tube be changed, as a result of the input impulse, by an amount causing that tube, before the end of the impulse but after its peak, to have such conductivity as to cause the magnitude of the emitter current to be as far, or farther, toward the final state magnitude as it was at the peak of the input impulse. More specifically, to switch from the first to the second stable state with an impulse appearing simultaneously at point 28 and grid 21, it is necessary that the impulse at point 28 cause an increase in the collector current sufficient to reduce the impedance of the tube to an extent avoiding any decrease in the collector current as the impulse ends and resulting in a further increase in the collector current if necessary to complete switching. Stated another way, the tube must be sufficiently conductive as the impulse passes its peak to conduct enough current that the emitter current does not decrease and even increases if necessary for switching.

To switch from the second to the first stable state in response to an impulse appearing simultaneously at point 28 and grid 21, it is necessary that the input impulse shall cause the conductivity of the tube to decrease and to remain at such a lower level that the emitter current begins to decrease after the impulse passes its peak.

That the conditions set forth above are necessary for a scaling operation of the trigger circuit in response to an input impulse appearing simultaneously as indicated will become clear in the subsequent description of the operation of the circuit of Fig. 4. It may be possible to meet these conditions by use of a particular transistor, tube and load resistor combination. However, it is believed preferable and more reliable to have a circuit in which the conditions are met by providing a more rapid tube response during the initial stages of a switching operation. This may be done by providing suitable voltage change delay elements in the circuit. It is for this purpose that the condenser 30 with its shunt resistor 31 as well as the condenser 33 are provided. The condenser 30 with its shunt resistor 31 is effective to delay changes in the voltage level of the cathode 19 of the tube 18 after the tube is changed from a non-conductive to a conductive condition or vice versa and cause a greater initial rate of change in conductivity. The condenser 33 is effective to delay changes in voltage across that portion of the resistor 14 between the grid 21 and collector *c* and thereby increases the initial rate of change in voltage across that portion of resistor 14 between tap 27 and line 15 to cause a greater initial rate of change in tube conductivity.

It is difficult, of course, to determine exactly what happens in all parts of the trigger circuit of Fig. 4 during switching operations but it is believed to operate as hereinafter described, keeping in mind the operation of the circuit of Fig. 2 as previously set forth.

When the trigger circuit is in the first stable state, the tube 18, of course, is non-conductive and a minimum current flows through the collector $c$ and the resistor 14 while the condensers 30 and 33 have a minimum charge thereon. An input impulse, negative with respect to the ground, then appears simultaneously at the point 28 and at the grid 21 of tube 18. As the tube 18 is already non-conductive, the input impulse on its grid 21 has no immediate effect upon the conductivity of the tube. The simultaneous negative impulse at point 28 causes a substantial increase in the emitter current with a corresponding increase in the collector current. The increase in the collector current acts through the resistor 14 to tend to raise the voltage of the grid 21. The raising of the voltage of grid 21 by the action of resistor 14 is opposed by the input impulse applied to the grid. However, the voltage increase on resistor 14 is greater and the resultant grid voltage rises sufficiently to cause tube 18 to conduct before the input impulse ends. In this connection, condenser 33, having an initial minimum charge, is effective to delay any increase in voltage across the portion of resistor 14 between the grid 21 and the collector $c$. Consequently, almost all of the initial voltage change in the resistor 14 produced by the change in collector current, appears between the tap 27 and the negative line 15. This tends to increase the grid voltage more rapidly so that the tube 18 becomes conductive sooner and the rate of increase of the conductivity of the tube is greater than otherwise.

When the tube 18 becomes conductive, the condenser 30 being initially discharged, tends to maintain the cathode 19 at its original voltage level, allowing the cathode voltage to rise gradually as the condenser becomes charged. Consequently, with the rising grid voltage, the action of the condenser 30 in keeping the cathode at a lower voltage, is effective to cause the conductivity of the tube to increase more rapidly than otherwise.

The rapid increase in conductivity thus provided through the action of condensers 30 and 33 results in the tube 18 becoming sufficiently conductive that after the input impulse passes its peak, the emitter current does not decrease but may increase still further. Consequently, the trigger circuit is rapidly switched from the first to the second stable state.

When the trigger circuit of Fig. 4 is in the second stable state, the tube 18 is highly conductive and a maximum current flows through the collector $c$ and the resistor 14 while the condensers 30 and 33 have a maximum charge thereon. A negative input impulse appearing simultaneously at the point 28 and at the grid 21 of the tube 18 causes a switching of the trigger circuit to the first stable state.

The input impulse at the grid 21 causes the tube 18 to become non-conductive. The rendering of the tube 18 non-conductive probably does not substantially reduce the emitter current at first because the simultaneous negative impulse at point 28 tends to keep the emitter current high and may even cause it to increase. However, in the second stable state the circuit is in the highly conductive condition wherein the increase in the emitter current does not produce any substantial increase in the collector current. Then, as the input impulse begins to decrease after passing its peak point, the effect of the input impulse at point 28 in maintaining the emitter current high is decreased. At this time the tube 18 is still non-conductive, particularly because of the condenser 30 which tends to maintain the cathode 19 at a high voltage. Consequently, the emitter current starts to decrease, causing a corresponding decrease in the collector current. The resultant change in voltage across the resistor 14 is again concentrated primarily in that portion of the resistor between the tap 27 and the negative line 15. As the condenser 33 is effective to delay any increase in voltage across the portion of the resistor 14 between the tap 27 and the collector $c$, the change in voltage across the resistor 14 between tap 27 and line 15 is sufficiently rapid to maintain the tube 18 non-conductive as the input impulse is removed. Thus, the trigger circuit is switched from the second to the first stable state.

Switching from the second to the first stable state may also be effected in an arrangement in which the tube 18 is not made non-conductive but merely substantially less conductive by the input impulse. Then as the emitter and collector currents drop, the tube becomes less and less conductive until it becomes substantially non-conductive.

The use of both of the condensers 30 and 33 is believed to be preferable because of increased reliability and speed. It has been determined experimentally, however, that the trigger circuit may be switched back and forth in a scaling operation in response to successive input impulses with only one of these condensers incorporated in the circuit.

Figure 5:
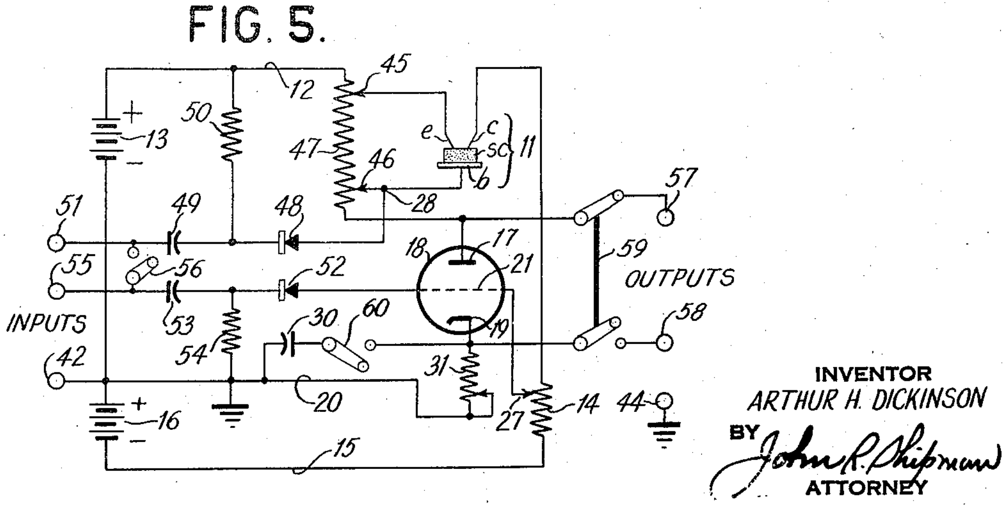
Figs. 5 and 6 are circuit diagrams of modifications of the trigger circuit of Fig. 2.

Fig. 5 discloses a modification of my invention which employs the same principles utilized and explained in connection with Fig. 2. The same reference numerals are used in Fig. 5 as in Fig. 2 and Fig. 4 to designate the same or corresponding elements.

The circuit of Fig. 5 differs from that of Fig. 2 primarily in that the emitter $e$ and base $b$ of the translating device 11 are connected, by means of adjustable taps 45 and 46, respectively, in shunt with a resistor 47; and an adjustable resistor 31 is connected between the cathode 19 of the tube 18 and the grounded line 20. In addition, the point 28 at the base $b$ is coupled by a diode rectifier 48 and a suitable differentiating circuit comprising a capacitor 49 and a resistor 50 to an input terminal 51. Similarly, the grid 21 of the tube 18 is coupled through a rectifier 52 and a differentiating circuit comprising capacitor 53 and resistor 54 to another input terminal 55. A normally opened switch 56 is connected between terminals 51 and 55 permitting them to be used independently of each other or simultaneously by a single input supply. Two different output terminals 57 and 58 are provided for selective use with the grounded output terminal 44, the selection being accomplished through a switch 59. A condenser 30 is also connected through a normally open switch 60 in shunt across the resistor 31.

If the input impulses are to be supplied independently in Fig. 5 to the point 28 and the grid 21 through terminals 51 and 55, alternately, then switch 56 should remain open and switch 60 may be either opened or closed. The circuit then operates substantially as in the manner described for the circuit of Fig. 2. The resistor 47 serves to permit easy adjustment of the voltage level between the emitter $e$ and the base $b$ of the translating device 11 while the tube 18 is conductive. It also enables suitable voltage variations to be produced at the anode 17 of the tube 18 in the event that the output terminal 57 is to be employed. However, as is evident from Figs. 2 and 4 this resistor may be omitted if desired.

The resistor 31 provides a suitable voltage variation at the cathode 19 of the tube 18 in the event it is desired to use the output terminal 58 as a low impedance impulse source.

To obtain a scaling operation with the circuit of Fig. 5, it is necessary to incorporate the condenser 30 actively in the circuit by closing switch 60 for the reasons explained in connection with Fig. 4. Then the switch 56 should be closed so that a series of single input impulses applied to either of the input terminals 51 or 55 appear simultaneously at point 28 and the grid 21. The switching operation of the Fig. 5 circuit under these conditions is similar to that described for the circuit of Fig. 4.

If the switch 60 remains open while switch 56 is closed, the action of the circuit upon a negative impulse appearing concurrently at both the point 28 and the grid 21 varies with variations in the time constants of the differentiating circuits comprising condenser 49 and resistor 50 and the condenser 53 and resistor 54. It seems apparent that with one set of time constants concurrent impulses at point 28 and the grid 21 may effect a switching of the trigger circuit from the first to the second stable state but cannot effect a switching from the second to the first stable state. With a different set of time constants, the trigger circuit may be switched from the second to the first stable state but not from the first to the second stable state.

It will be evident also that with switch 56 open, the trigger circuit of Fig. 5 still may be switched between its two states by successive input impulses if these input impulses are applied alternately to point 28 and grid 21 or if two series of out-of-phase input impulses are applied to point 28 and grid 21, respectively.

Figure 6:
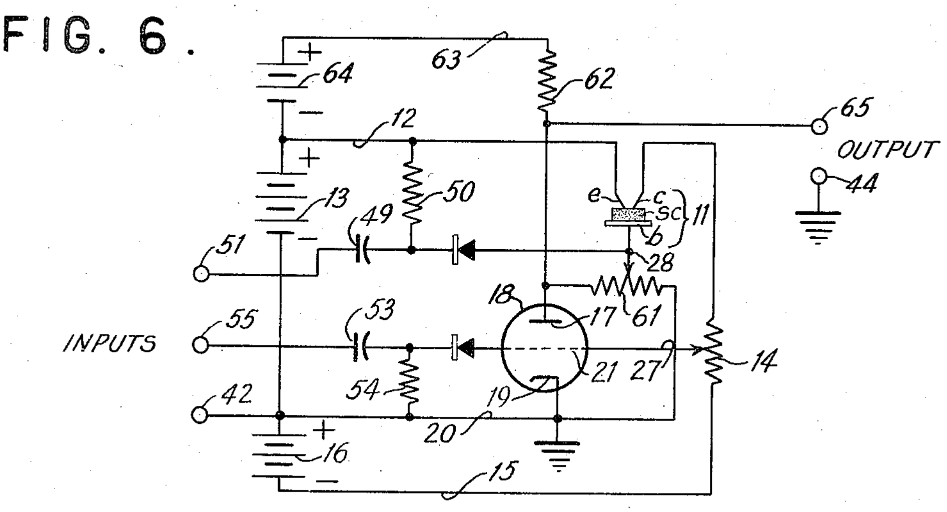

Another modification of my invention is shown in Fig. 6. This circuit also operates on the same principles set forth in the discussion of Fig. 2. The same reference numerals used in Figs. 2 and 5 are applied to corresponding elements in Fig. 6. However, in the circuit of Fig. 6, a resistor 61 is provided with a portion thereof connected between the base *b* of the translating device 11 and the anode 17 of the tube 18 while the remainder of the resistor 61 is connected between the base *b* and the cathode 19 of the tube. The anode 17 is also connected through an additional resistor 62 to another voltage supply line 63 maintained at a more positive voltage level than the supply line 12 as, for example, by the battery 64. An output terminal 65 is connected to the anode 17 of the tube 18.

In the circuit of Fig. 6 it is to be noted that in the first stable state of the trigger circuit, wherein tube 18 is non-conductive, the resistors 62 and 61 form a divider between the supply lines 63 and 20 which results in the voltage level of the base *b* being at or near that of supply line 12. Therefore, substantially no current flows from the emitter through base *b*. However, a small current does flow from the emitter through the collector *c*. When a negative input impulse is applied at point 28, the emitter and collector currents are increased in the manner described in connection with Fig. 2 to cause tube 18 to become conductive. As tube 18 becomes conductive it causes a decrease in the IR drop across the resistor 61, lowering the voltage level of the base *b* to cause a further increase in the emitter current. A switching operation is thus initiated.

When the circuit of Fig. 6 is in its second stable state with the tube 18 highly conductive, the base *b* is at its lowest voltage level and the maximum emitter current is flowing. A negative input impulse applied to the grid 21 causes the tube 18 to become less conductive, thereby raising the voltage level of the base *b* to decrease the emitter current and initiate a switching operation.

Figure 7:
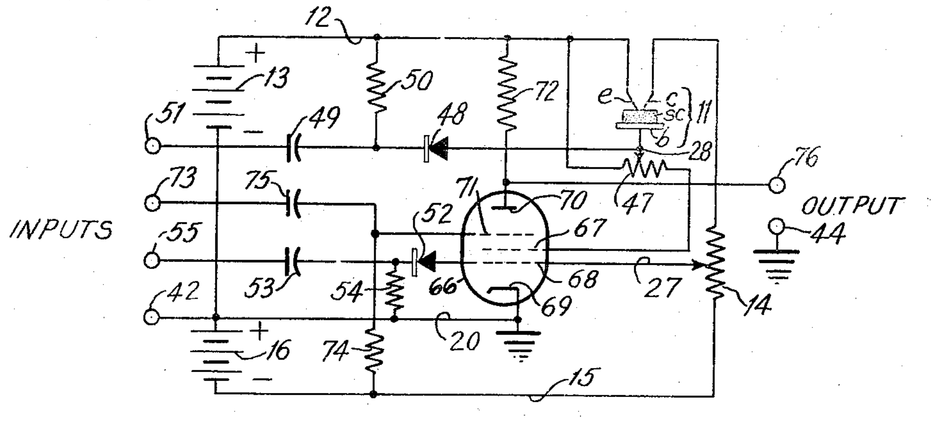
Fig. 7 is a circuit diagram of a gate circuit incorporating my invention.

A gated trigger circuit making use of and incorporating my invention is shown in Fig. 7. In this circuit a pentode 66 is employed with the screen grid 67, control grid 68 and cathode 69 thereof acting as a vacuum tube in combination with the translating device 11 in a trigger circuit arrangement somewhat similar to the one shown in Fig. 5. The path through the anode 70 and the cathode 69 under the control of the suppressor grid 71 of the pentode is the gated path which is to be opened and closed by the action of the trigger circuit arrangement.

The anode 70 of the pentode 66 is connected through a resistor 72 to the positive voltage supply line 12. The cathode 69 of the pentode is connected directly to the grounded supply line 20. The emitter *e* and base *b* of the translating device 11 are connected in shunt across a portion of the resistor 47 connected between the supply line 12 and the screen grid 67 of the pentode 66. The resistor 47 is not necessary to the operation of the device as explained in connection with Fig. 5, but in some cases aids in securing proper adjustments. The collector *c* of the translating device 11 is connected as usual through the resistor 14 to the negative supply line 15, and the adjustable tap 27 on resistor 14 is connected to the control grid 68 of the pentode 66. The point 28 at the base *b* of the translating device 11 is coupled to the input terminal 51 and the control grid 68 is coupled to the input terminal 55. The suppressor grid 71 of the pentode 66 is coupled to another input terminal 73 through a suitable differentiating circuit comprising resistor 74 and condenser 75.

The trigger circuit arrangement in Fig. 7 comprising the transistor 11, resistors 14 and 47, and that portion of the pentode 66 consisting of screen grid 67, control grid 68 and the cathode 69, together with the input circuits for supplying negative voltage impulses to either the control grid 68 or the point 28, operate in the same manner set forth in connection with the circuit shown in Fig. 5. Thus, in the first stable state of this trigger circuit arrangement, substantially no current flows between the screen grid 67 and cathode 69 of the pentode 66. In the second stable state of the trigger circuit arrangement, a maximum current flows between the screen grid 67 and the cathode 69. Switching of the trigger circuits between the two alternate stable states is accomplished as previously described by impressing a negative voltage impulse alternately on terminals 51 and 55.

For current to flow between the anode 70 and the cathode 69 of the pentode 66 two conditions are necessary. First, the suppressor grid 71 must be at a voltage permitting current flow, and second, current must be flowing between the screen grid 67 and cathode 69. The second requirement is met only when the trigger circuit arrangement in Fig. 7 is in its second stable state. In the operation of the circuit of Fig. 7 as a gate, therefore, suitable impulses may be applied at the terminal 73 to cause the suppressor grid 71 to tend to cause corresponding impulses to pass between the anode and cathode of the pentode. At the same time, a second control source may be employed to switch the trigger arrangement of the circuit between the first and second stable states in accordance with changes in a selected external condition. Thus, as long as that external condition causes the trigger arrangement to be in its second stable state, the impulses applied to the suppressor grid result in corresponding impulses passing between the anode and cathode of the pentode which impulses appear on an output terminal 76 connected to the anode. On the other hand when the external conditions cause the trigger arrangement to be in its first stable state, no impulses whatsoever pass between the anode and cathode and none appear at the output terminal 76.

While the translating devices specifically illustrated and described herein have been of the type comprising a semiconductor with a large area, ohmic base connection and point contact, rectifying, emitter and collector connections, it is to be understood that my invention is not restricted to the use of this specific type of translating device. In the broadest aspects of my invention, the important characteristic of the translating device in the amplifier and trigger circuits is that when the translating device is suitably connected to a voltage supply, the output current from the device varies in accordance with, and in the same direction as, variations in the input voltage applied to the device.

In the slightly narrower aspects of my invention, the translating device includes a semiconductor connected to an output circuit to provide a relatively high impedance to current flowing to the output circuit. This impedance, as previously discussed, is provided by an electrical barrier through which it is difficult for current carriers of the sign of the carriers normally in the semiconductor to pass in the direction of flow of the output current. Input circuit connections are also provided for such a device with input current therethrough introducing into the semiconductor current carriers of opposite sign to those normally present therein, which introduced carriers may more easily pass through the barrier, whereby the impedance to the output current is varied in accordance with variations in the input current.

In the somewhat more specific aspects of my invention, the translating device comprises a semiconductor provided with emitter, collector and base connections which may be of the type illustrated in the drawings or of some other suitable type. In such a device, it is only necessary, with suitable connections to the voltage supply, that the emitter be effective to pass current with low impedance to the semiconductor and thereby introduce into said semiconductor current carriers of a sign opposite to that of carriers normally present therein, that the collector be effective to pass current from the semiconductor, which current encounters an impedance within the device which varies in accordance with the number of carriers introduced into the semiconductor by the emitter current, and that the base be effective to pass current into or out of the semiconductor with a relatively low impedance. Such a device is meant upon reference to a translating device comprising a semiconductor having emitter, collector and base connections.

It is to be noted that although the amplifiers and trigger circuits described herein in detail and illustrated in the drawings incorporate an impedance in the form of a vacuum tube in the circuit between the base of the translating device and the voltage supply, my invention in its broader aspects also applies to amplifiers and trigger circuits wherein the tube may be connected in other parts of the circuit as, for example, between the emitter and the voltage supply. Specific circuits incorporating a tube between the emitter and the voltage supply are shown and described in my copending application Serial No. 177,447 filed concurrently herewith.

A particular arrangement providing for the operation of a plurality of trigger circuits of the type shown and described herein is shown and described in my copending application Serial No. 177,445.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. An amplifier circuit comprising a translating device including a semiconductor having an emitter, collector and base; a variable impedance member having a control element; three direct current voltage supply lines, the second being less positive than the first and more positive than the third; first circuit means connecting the emitter to the first line; second circuit means connecting the base through the impedance member to the second line; and third circuit means including a load resistor connecting the collector to the third line; said control element being adapted to receive an input signal voltage and responsive to variations in said input to vary the impedance of said member in accordance therewith.

2. An amplifier circuit comprising a translating device including a semiconductor having an emitter, collector and base; a vacuum tube having an anode, cathode and control grid; three direct current voltage supply lines, the second being less positive than the first and more positive than the third; first circuit means connecting the emitter to the first line; second circuit means connecting the base through said tube to the second line and including means connecting said anode to the base and said cathode to the second line; and third circuit means including a resistor connecting the collector to the third line; said control grid being adapted to receive an input signal voltage and responsive to variations in said input to vary the impedance of the tube in accordance therewith.

3. A trigger circuit comprising a translating device including a semiconductor having emitter, collector and base connections; a vacuum tube having an anode, cathode and control grid; three direct current voltage supply lines, the second being less positive than the first and more positive than the third; first circuit means connecting the emitter to the first line; second circuit means connecting the base through said tube to the second line and including means connecting said anode to the base and said cathode to the second line; and third circuit means including a resistor connecting the collector to the third line; said control grid being connected to said resistor in a positive feedback arrangement to vary the conductivity of the tube, and thereby the emitter current, directly with variations in collector current.

4. A trigger circuit comprising a translating device including a semiconductor having emitter, collector and base connections; a vacuum tube having an anode, cathode and control grid; three direct current voltage supply lines, the second being less positive than the first and more positive than the third; first circuit means connecting the emitter to the first line; second circuit means connecting the base through said tube to the second line and including means connecting said anode to the base and said cathode to the second line; third circuit means including a resistor connecting the collector to the third line, said control grid being connected to said resistor in a positive feedback arrangement to vary the conductivity of the tube, and thereby the emitter current, directly with variations in collector current; a first input connection to said control electrode adapted to receive negative input voltage impulses to inititate a decrease in emitter current; and a second input connection to said base adapted to receive negative input voltage impulses to initiate an increase in emitter current.

5. A trigger circuit having two alternate stable states and comprising a translating device including a semiconductor having emitter, collector and base connections; a vacuum tube having an anode, a cathode and control grid; a direct current voltage supply having a positive, a negative and in intermediate terminal; first circuit means connecting the emitter to the positive terminal; second circuit means connecting the base through said tube to the intermediate terminal comprising means connecting said anode to the base and said cathode to the intermediate terminal; third circuit means including a resistor connecting the collector to the negative terminal; means connecting said control grid to the negative terminal through at least a portion of said resistor to establish a control circuit for said tube extending from said control grid to said cathode and including said resistor portion to provide a positive feedback arrangement to vary the conductivity of the tube, and thereby the emitter current, directly with variations in collector current; whereby in a first stable state the collector current, emitter current and current through the tube are all at a minimum and in a second stable state they are all at a maximum; input connections to said base and control electrode adapted to receive a series of negative input voltage impulses with each impulse appearing simultaneously at the base and control electrode to initiate emitter current changes; and means connected in said control circuit to increase the initial rate of change of the impedance of the tube with a change in collector current permitting each input impulse to cause the trigger circuit to change from one stable state to the other.

6. A trigger circuit having two alternate stable states and comprising a translating device including a semiconductor having emitter, collector and base connections; a vacuum tube having an anode, a cathode and control grid; three direct current voltage supply lines, the second being less positive than the first and more positive than the third; first circuit means connecting the emitter to the first line; second circuit means connecting the base through said tube to the second line comprising means connecting said anode to the base and means, including a condenser shunted by a first resistor, connecting said cathode to the second line; third circuit means including a second resistor connecting the collector to the third line; means connecting said control grid to said third line through at least a portion of said second resistor in a positive feedback arrangement to vary the conductivity of the tube, and thereby the emitter current, directly with variations in collector current; whereby in a first stable state the collector current, emitter current and current through the tube are all at a minimum and in a second stable state they are all at a maximum; and input connections to said base and control electrode adapted to receive a series of negative input voltage impulses with each impulse appearing simultaneously at the base and control electrode to initiate emitter current changes; said condenser and first resistor having a time constant delaying changes in the voltage level of said cathode to permit each input impulse to cause the trigger circuit to change from one stable state to the other.

7. A trigger circuit having two alternate stable states and comprising a translating device including a semiconductor having emitter, collector and base connections; a vacuum tube having an anode, a cathode and control grid; three direct current voltage supply lines, the second being less positive than the first and more positive than the third; first circuit means connecting the emitter to the first line; second circuit means connecting the base through said tube to the second line comprising means connecting said anode to the base and said cathode to the second line; third circuit means including a resistor connecting the collector to the third line; means connecting said control grid to an intermediate point on said resistor in a positive feedback arrangement to vary the conductivity of the tube, and thereby the emitter current, directly with variations in collector current; whereby in a first stable state the collector current, emitter current and current through the tube are all at a minimum and in a second stable state they are all at a maximum; input connections to said base and control electrode adapted to receive a series of negative input voltage impulses with each impulse appearing simultaneously at the base and control electrode to initiate emitter current changes; and a condenser connected in shunt across that portion of the resistor between said intermediate point and the end thereof remote from the third line, said condenser delaying changes in voltage across said resistor portion to permit each input impulse to cause the trigger circuit to change from one stable state to the other.

8. A trigger circuit having two alternate stable states and comprising a translating device including a semiconductor having emitter, collector and base connections; a vacuum tube having an anode, a cathode and control grid; three direct current voltage supply lines, the second being less positive than the first and more positive than the third; first circuit means connecting the emitter to the first line; second circuit means connecting the base through said tube to the second line comprising means connecting said anode to the base and means, including a first condenser shunted by a first resistor, connecting said cathode to the second line; third circuit means including a second resistor connecting the collector to the third line; said control grid being connected to an intermediate point on said second resistor in a positive feedback arrangement to vary the conductivity of the tube, and thereby the emitter current, directly with variations in collector current; whereby in a first stable state the collector current, emitter current, and current through the tube are all at a minimum and in a second stable state they are all at a maximum; input connections to said base and control electrode adapted to receive a series of negative input voltage impulses with each impulse appearing simultaneously at the base and control electrode to initiate emitter current changes; and a second condenser connected in shunt across that portion of the resistor between said intermediate point and the end thereof remote from the third line; said first condenser and first resistor having a time constant delaying changes in the voltage level of said cathode and the said second condenser delaying changes in the voltage across said shunted resistor portion, to permit each input impulse to cause the trigger circuit to change from one stable state to the other.

9. A trigger circuit comprising a translating device including a semiconductor having emitter, collector and base connections; a vacuum tube having an anode, cathode and control grid; three direct current voltage supply lines, the second being less positive than the first and more positive than the third; a first resistor connected from said first line to the anode; means connecting said cathode to the second line; circuit means connecting the emitter and base in shunt across an adjustable portion of said first resistor; and circuit means including a resistor connecting the collector to the third line; said control grid being connected to said resistor in a positive feedback arrangement to vary the conductivity of the tube, and thereby the emitter current, directly with variations in collector current.

10. A trigger circuit comprising four direct current voltage supply lines, the first being more positive than the second which is more positive than the third which, in turn, is more positive than the fourth; first and second resistors connected in series in the order named between the first and third supply lines; a translating device including a semiconductor having emitter, collector and base connections, said emitter being connected to the second supply line, and said base being connected to an intermediate point on said second resistor; means including a load resistor connecting said collector to the fourth supply line; a vacuum tube having an anode, cathode and control grid, said anode being connected to a junction between said first and second resistors and said cathode being connected to the third supply line; and means connecting said control grid to said resistor in a positive feedback arrangement to vary the conductivity of the tube, and thereby the emitter current, directly with variations in collector current.

11. A gated trigger circuit comprising a pentode having an anode, cathode, control grid, screen grid and suppressor grid; three direct current voltage supply lines, the second being less postitive than the first and more positive than the third; a translating device including a semi-conductor having emitter, collector and base connections, said emitter being connected to the first line; means connecting the base to said screen grid; means connecting the cathode to the second line; means including a resistor connecting the collector to the third line; means connecting the control grid to said resistor in a positive feedback arrangement to vary the conductivity between the screen grid and cathode directly with variations in collector current and thereby to vary the emitter current; whereby the circuit has two alternate stable states with current through the emitter, collector and the screen grid and cathode being at a maximum in the first state and at a minimum in the second state; input circuits connected to said base and to said control grid and adapted to receive input voltage impulses to initiate a change in the emitter current and cause switching from one stable state to the other; circuit means connecting said anode to the first line; and input means connected to the suppressor grid and adapted to receive voltage signals to cause corresponding variations in anode current when the circuit is in the first stable state.

12. A circuit arrangement comprising an electron discharge device having output, cathode and grid electrodes, a transistor having emitter, collector and base electrodes, means conductively connecting said base electrode to said output electrode, means for applying operating potentials to said electrodes including means connecting the cathode-output electrode path of said device and the emitter-base path of said transistor in a common current path and including means to render said collector negative and said emitter positive with respect to said cathode, and means for applying an input signal to said grid electrode to control the amplitude of the current flow through said device and said transistor.

13. A circuit arrangement in accordance with claim 12 including feedback means connecting said collector electrode to said grid electrode to provide a trigger circuit.

14. A circuit arrangement comprising an electron discharge device having output, cathode and grid electrodes, a transistor having emitter, collector and base electrodes, means for applying operating potentials to said electrodes including means connecting the cathode-output electrode path of said device and the emitter-base path of said transistor in a common current series path and including means to render said collector negative and said emitter positive with respect to said base, and means for applying an input signal to said grid electrode to control the amplitude of the current flow through said device and said transistor.

15. A circuit arrangement in accordance with claim 14 including feedback means connecting said collector electrode to said grid electrode to provide a trigger circuit.

References Cited in the file of this patent

UNITED STATES PATENTS

| | | |
|---|---|---|
| 2,006,872 | Nyman | July 2, 1935 |
| 2,404,919 | Overbeck | July 30, 1946 |
| 2,494,865 | Fleming-Williams et al. | Jan. 17, 1950 |
| 2,517,960 | Barney et al. | Aug. 8, 1950 |
| 2,524,035 | Bardeen et al. | Oct. 3, 1950 |
| 2,533,001 | Eberhard | Dec. 5, 1950 |
| 2,562,530 | Dickinson | July 31, 1951 |
| 2,633,528 | Hutson | Mar. 31, 1953 |
| 2,659,775 | Coulter | Nov. 17, 1953 |